US012687662B2

(12) United States Patent
Li et al.

(10) Patent No.: US 12,687,662 B2
(45) Date of Patent: Jul. 21, 2026

(54) DISPLAY PANEL, METASURFACE LENS AND MANUFACTURING METHOD THEREOF

(71) Applicant: BOE Technology Group Co., Ltd., Beijing (CN)

(72) Inventors: Duohui Li, Beijing (CN); Kang Guo, Beijing (CN); Mengya Song, Beijing (CN); Dongliang Zhang, Beijing (CN); Hong Chen, Beijing (CN); Xiang Li, Beijing (CN); Dongfei Hou, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 426 days.

(21) Appl. No.: 18/271,869

(22) PCT Filed: Jun. 14, 2022

(86) PCT No.: PCT/CN2022/098591
§ 371 (c)(1),
(2) Date: Jul. 12, 2023

(87) PCT Pub. No.: WO2023/240432
PCT Pub. Date: Dec. 21, 2023

(65) Prior Publication Data
US 2024/0385353 A1 Nov. 21, 2024

(51) Int. Cl.
*G02B 3/08* (2006.01)
*H10K 59/38* (2023.01)
*H10K 59/80* (2023.01)

(52) U.S. Cl.
CPC .............. *G02B 3/08* (2013.01); *H10K 59/38* (2023.02); *H10K 59/879* (2023.02); *G02B 2207/101* (2013.01)

(58) Field of Classification Search
CPC .............. G02B 2207/101; G02B 1/002; G02B 3/0043; G02B 3/0062; G02B 3/0068;
(Continued)

(56) References Cited

U.S. PATENT DOCUMENTS

2005/0224975 A1 10/2005 Basavanhally et al.
2006/0183395 A1 8/2006 Xu et al.
(Continued)

FOREIGN PATENT DOCUMENTS

CN 1775656 A 5/2006
CN 102096348 A 6/2011
(Continued)

OTHER PUBLICATIONS

PCT/CN2022/098591 international search report.
PCT/CN2022/098591 Written Opinion.

*Primary Examiner* — Angela M. Medich
(74) *Attorney, Agent, or Firm* — IPro, PLLC

(57) ABSTRACT

The present disclosure provides a display panel, a metasurface lens, and a manufacturing method thereof. The metasurface lens includes: a first substrate and a second substrate disposed opposite to each other; multiple first micro nanostructures arranged at intervals on one side of the first substrate facing the second substrate; multiple second micro nanostructures arranged at intervals on one side of the second substrate facing the first substrate; wherein at least one of the first micro nanostructures is located in gaps between multiple of the second micro nanostructures, and at least one of the second micro nanostructures is located in gaps between multiple of the first micro nanostructures. The present disclosure can reduce the difficulty of the manufacturing process.

20 Claims, 8 Drawing Sheets

(58) Field of Classification Search
CPC . G02B 27/42; G02B 27/4205; G02F 2202/36; G02F 2201/305; B82Y 30/00; B82Y 40/00; H10K 59/879; H10K 59/28
See application file for complete search history.

(56) References Cited

U.S. PATENT DOCUMENTS

| | | | |
|---|---|---|---|
| 2008/0002213 A1 | 1/2008 | Weiss | |
| 2009/0015142 A1* | 1/2009 | Potts | H10K 59/877 |
| | | | 977/773 |
| 2017/0131460 A1 | 5/2017 | Lin et al. | |
| 2018/0157058 A1 | 6/2018 | Chou et al. | |
| 2022/0082794 A1* | 3/2022 | Kim | G02B 13/003 |

FOREIGN PATENT DOCUMENTS

| | | | |
|---|---|---|---|
| CN | 108474901 A | 8/2018 |
| CN | 111913243 A | 11/2020 |
| CN | 112213915 A | 1/2021 |
| CN | 113219562 A | 8/2021 |
| CN | 113471390 A | 10/2021 |
| CN | 113687515 A | 11/2021 |
| CN | 113990908 A | 1/2022 |
| JP | 2017175201 A | 9/2017 |
| WO | 2021133250 A1 | 7/2021 |

* cited by examiner

DISPLAY PANEL, METASURFACE LENS AND MANUFACTURING METHOD THEREOF

CROSS-REFERENCE TO RELATED APPLICATIONS

The present application is a U.S. National Phase of International Application No. PCT/CN2022/098591, filed Jun. 14, 2022, the entire contents of which are hereby incorporated by reference for all purposes.

TECHNICAL FIELD

The present disclosure relates to the field of display technology, and more particularly, to a display panel, a metasurface lens and a manufacturing method thereof.

BACKGROUND

A metasurface lens is a two-dimensional optical device that provides a new idea for achieving light field regulation at sub wavelength spatial scales. Compared to traditional three-dimensional structural materials, their thickness can be controlled in the sub wavelength to deep sub wavelength range, making them have important application prospects in fields such as spatial light field regulation and planar optics. However, the manufacturing process of existing metasurface lenses is relatively difficult.

SUMMARY

The objective of the present disclosure is to provide a display panel, a metasurface lens, and a manufacturing method thereof, which can reduce the difficulty of the manufacturing process.

According to an aspect of the present disclosure, there is provided a metasurface lens, including:

a first substrate and a second substrate disposed opposite to each other;

multiple first micro nanostructures arranged at intervals on one side of the first substrate facing the second substrate;

multiple second micro nanostructures arranged at intervals on one side of the second substrate facing the first substrate;

wherein at least one of the first micro nanostructures is located in gaps between multiple of the second micro nanostructures, and at least one of the second micro nanostructures is located in gaps between multiple of the first micro nanostructures.

Further, some of the first micro nanostructures and some of the second micro nanostructures are arranged in a staggered manner in a first direction.

Further, multiple of the first micro nanostructures form multiple first structural columns, and the multiple first structural columns are distributed along the first direction; multiple of the second micro nanostructures form multiple second structural columns, and the multiple second structural columns are distributed along the first direction;

the multiple first structural columns correspond to the multiple second structural columns one by one, and multiple first micro nanostructures in each first structural column are staggered with multiple second micro nanostructures in corresponding second structural column along an extension direction of the first structural column.

Further, adjacent two of the first structural columns are arranged in a staggered manner, and of three first structural columns arranged in sequence, the first structural columns located on both ends are aligned;

adjacent two of the second structural columns are arranged in a staggered manner, and for three second structural columns arranged in sequence, the second structural columns located on both ends are aligned.

Further, a refractive index of the first micro nanostructure is the same as or different from a refractive index of the second micro nanostructure.

Further, a material of the first micro nanostructure is the same as or different from a material of the second micro nanostructure.

Further, a size of the first micro nanostructure in a direction perpendicular to the first substrate is 200 nm-1000 nm; and/or a size of the first micro nanostructure in a direction parallel to the first substrate is 20 nm-300 nm; and/or a size of the second micro nanostructure in a direction perpendicular to the second substrate is 200 nm-1000 nm; and/or a size of the second micro nanostructure in a direction parallel to the second substrate is 20 nm-300 nm.

Further, a number of the second substrates is multiple, and the multiple second substrates are located on the same side of the first substrate, with different second substrates corresponding to different areas of the first substrate.

Further, the metasurface lens further includes:

a transparent filling layer disposed between the first substrate and the second substrate, and surrounds the first micro nanostructures and the second micro nanostructures, a refractive index of the transparent filling layer is lower than that of the first micro nanostructure or of the second micro nanostructure.

Further, the metasurface lens further includes:

a connecting structure connected between the first substrate and the second substrate, in a direction perpendicular to the first substrate, a size of the first micro nanostructure and/or a size of the second micro nanostructure is smaller than a size of the connecting structure.

Further, the first substrate includes a first imprinting area, and the first micro nanostructures are located in the first imprinting area; the second substrate includes a second imprinting area, with the second micro nanostructures are located in the second imprinting area;

the connecting structure is connected to an area of the first substrate outside the first imprinting area, and connected to an area of the second substrate outside the second imprinting area.

Further, a size of the first micro nanostructure and/or a size of the second micro nanostructure is smaller than a size of the connecting structure by 20 nm-100 nm in a direction perpendicular to the first substrate.

Further, the connecting structure includes a colloidal material.

According to an aspect of the present disclosure, there is provided a display panel, including:

a light emitting unit;

the metasurface lens according to any one of claims 1-13, located on a light emitting side of the light emitting unit.

Further, the display panel further includes:

a color film substrate arranged on a light emitting side of the light emitting unit, wherein the metasurface lens is arranged on a side of the color film substrate facing away from the light emitting unit.

Further, the display panel further includes:

a color film substrate arranged on a light emitting side of the light emitting unit, wherein the color film substrate constitutes the first substrate, the second substrate is arranged on a side of the color film substrate facing away from the light emitting unit.

Further, the display panel further includes:

a color film substrate arranged on a light emitting side of the light emitting unit, wherein the metasurface lens is arranged between the color film substrate and the light emitting unit.

Further, the display panel further includes:

a first packaging layer arranged on the light emitting unit; wherein the metasurface lens is arranged on one side of the first packaging layer facing away from the light emitting unit.

Further, the display panel further includes:

a first packaging layer arranged on the light emitting unit; wherein the first packaging layer constitutes the first substrate, and the second substrate is located on one side of the first packaging layer facing away from the light emitting unit.

According to an aspect of the present disclosure, there is provided a manufacturing method of a metasurface lens, including:

providing a first substrate;

forming multiple first micro nanostructures arranged at intervals on one side of the first substrate;

providing a second substrate;

forming multiple second micro nanostructures arranged at intervals on one side of the second substrate;

aligning one side of the first substrate having the first micro nanostructures with one side of the second substrate having the second micro nanostructures to form a cell;

wherein at least one of the first micro nanostructures is located in gaps between multiple of the second micro nanostructures, and at least one of the second micro nanostructures is located in gaps between multiple of the first micro nanostructures.

Further, forming multiple first micro nanostructures arranged at intervals on one side of the first substrate includes: forming a first adhesive layer on one side of the first substrate, and imprinting the first adhesive layer to form multiple first micro nanostructures arranged at intervals; and/or forming multiple second micro nanostructures arranged at intervals on one side of the second substrate includes: forming a second adhesive layer on one side of the second substrate, and imprinting the second adhesive layer to form multiple second micro nanostructures arranged at intervals.

Further, the first adhesive layer and the second adhesive layers are imprinted with the same imprinting plate.

Further, a material of the first adhesive layer is the same as or different from a material of the second adhesive layer.

Further, a refractive index of the first adhesive layer is the same as or different from a refractive index of the second adhesive layer.

Further, before aligning one side of the first substrate having the first micro nanostructures with one side of the second substrate having the second micro nanostructures to form a cell, the manufacturing method further includes: filling transparent colloidal materials in gaps between the multiple first micro nanostructures; or, filling transparent colloidal materials in gaps between the multiple second micro nanostructures; or filling transparent colloidal materials in gaps between the multiple first micro nanostructures and gaps between the multiple second micro nanostructures; wherein a refractive index of the transparent colloidal material is smaller than the refractive index of the first micro nanostructure or the second micro nanostructure;

after aligning one side of the first substrate having the first micro nanostructures with one side of the second substrate having the second micro nanostructures to form a cell, the manufacturing method further includes:

curing the transparent colloidal materials through a heat curing process or an ultraviolet curing process to form a transparent filling layer.

In the display panel, the metasurface lens and the manufacturing method thereof of the present disclosure, the first substrate and the second substrate are arranged opposite to each other, the first micro nanostructures are located in gaps between the multiple second micro nanostructures, and the second micro nanostructures are located in gaps between the multiple first micro nanostructures, thereby the multiple first micro nanostructures and the multiple second micro nanostructures between the first substrate and the second substrate forming a metasurface lens. Moreover, since the first micro nanostructures are located on the side of the first substrate facing the second substrate, and the second micro nanostructures are located on the side of the second substrate facing the first substrate, the multiple micro nanostructures can be formed on the first substrate and the second substrate respectively during the manufacturing of the metasurface lens, instead of forming all micro nanostructures on the same substrate, which can reduce the difficulty of the manufacturing process.

Figure 1:
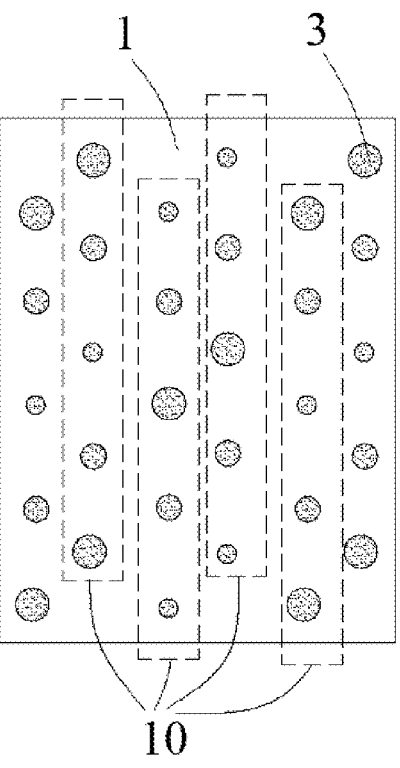
FIG. 1 is a schematic diagram of a first substrate and a first micro nanostructure in a metasurface lens according to an embodiment of the present disclosure.

Reference Numerals: 1. First substrate; 2. Second substrate; 3. First micro nanostructure; 4. Second micro nanostructure; 5. Transparent filling layer; 6. Connecting structure; 7. Light emitting unit; 71. Anode; 72. Light emitting layer; 73. Cathode; 8. First packaging layer; 9. Color film substrate; 10. First structural column; 11. Second structural column; 12. First residual adhesive layer; 13. Second residual adhesive layer; 14. Base substrate; 15. Active layer; 16. Gate insulation layer; 17. Gate electrode layer; 18. Interlayer insulation layer; 19. First source leakage electrode layer; 20. Second source leakage electrode layer; 21. First flattening layer; 22. Second flattening layer; 23. Pixel defining layer; 24. Active area; 25. Source drain electrode area; 26. First metal layer; 27. Second metal layer; 28. Second packaging layer.

DETAILED DESCRIPTION OF THE EMBODIMENTS

Embodiments will be described in detail herein, with the illustrations thereof represented in the drawings. When the following descriptions involve the drawings, like numerals in different drawings refer to like or similar elements unless otherwise indicated. The implements described in the following embodiments do not represent all implements consistent with the present disclosure. Rather, they are merely examples of apparatuses and methods consistent with some aspects of the present disclosure as detailed in the appended claims.

The terms used in the present disclosure are for the purpose of describing particular examples only, and are not intended to limit the present disclosure. Unless otherwise defined, technical or scientific terms used in the present disclosure shall have the usual meaning understood by individuals with general skills in the field to which the present disclosure belongs. The terms "first," "second," and similar terms used in the description and the claims of the present disclosure do not indicate any order, quantity, or importance, but are only used to distinguish different components. Similarly, terms such as "a" or "an" do not indicate a quantity limit, but rather indicate the existence of at least one. "A plurality of" or "several" indicates two or more. Unless otherwise specified, terms such as "front," "rear," "lower," and/or "upper" are only for convenience of explanation and are not limited to a position or spatial orientation. Similar terms such as "including" or "comprising" refer to components or objects that appear before "including" or "comprising", including those listed after "including" or "comprising" and their equivalents, and do not exclude other components or objects. Terms such as "connecting" or "connection" are not limited to physical or mechanical connections, and can include electrical connections, whether direct or indirect. Terms determined by "a," "the," and "said" in their singular forms in the present disclosure and the appended claims are also intended to include plurality, unless clearly indicated otherwise in the context. It should also be understood that the term "and/or" as used herein is and includes any and all possible combinations of one or more of the associated listed items.

The present disclosure provides a metasurface lens. As shown in FIGS. 1-6, the metasurface lens can include a first substrate 1, a second substrate 2, first micro nanostructures 3, and second micro nanostructures 4.

The first substrate 1 and the second substrate 2 are disposed opposite to each other. The first micro nanostructures 3 are located on one side of the first substrate 1 facing the second substrate 2. The number of the first micro nanostructures 3 is multiple, and the first micro nanostructures 3 are disposed at intervals. The second micro nanostructures 4 are located on one side of the second substrate 2 facing the first substrate 1. The number of the second micro nanostructures 4 is multiple, and the second micro nanostructures 4 are disposed at intervals. Here, at least one first micro nanostructure 3 is located in gaps between multiple second micro nanostructures 4, and at least one second micro nanostructure 4 is located in gaps between multiple first micro nanostructures 3.

The metasurface lens according to an embodiment of the present disclosure, wherein the first substrate 1 and the second substrate 2 are arranged opposite to each other, the first micro nanostructures 3 are located in gaps between the multiple second micro nanostructures 4, and the second micro nanostructures 4 are located in gaps between the multiple first micro nanostructures 3, thereby the multiple first micro nanostructures 3 and the multiple second micro nanostructures 4 between the first substrate 1 and the second substrate 2 forming a metasurface lens. Moreover, since the first micro nanostructures 3 are located on the side of the first substrate 1 facing the second substrate 2, and the second micro nanostructures 4 are located on the side of the second substrate 2 facing the first substrate 1, the multiple micro nanostructures can be formed on the first substrate 1 and the second substrate 2 respectively during the manufacturing of the metasurface lens, instead of forming all micro nanostructures on the same substrate, which can reduce the difficulty of the manufacturing process.

The following provides a detailed explanation of each part of the metasurface structure according to an embodiment of the present disclosure.

Figure 4:
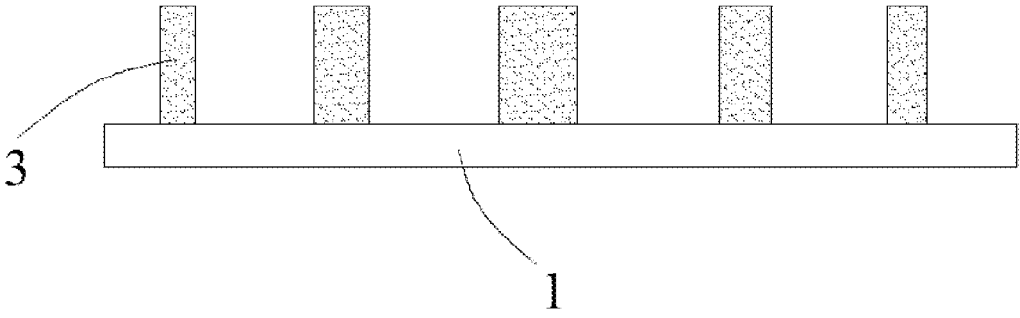
FIG. 4 is a cross-sectional view of the first substrate and the first micro nanostructure in the metasurface lens according to an embodiment of the present disclosure.

As shown in FIG. 4, the first substrate 1 can be a rigid substrate, such as a glass substrate. However, the first substrate 1 can also be a flexible substrate, such as a polyimide (PI) substrate. The thickness of the first substrate 1 can be 5 μm-1000 μm. It should be noted that the first substrate 1 is a transparent substrate.

Figure 5:
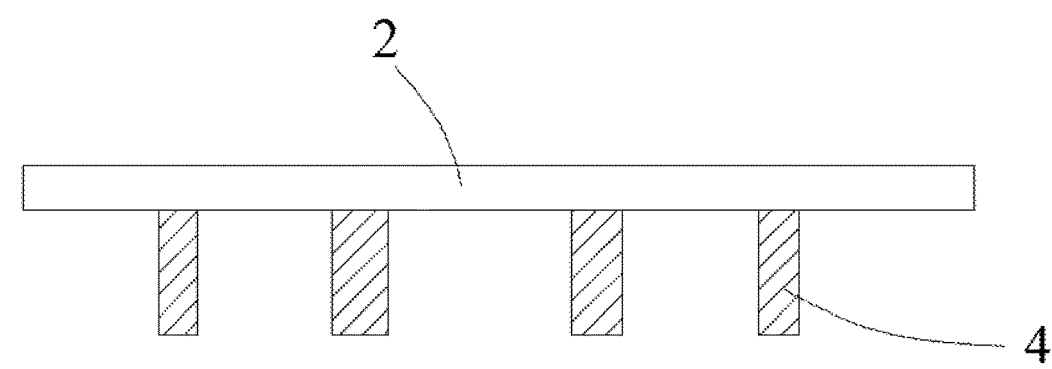
FIG. 5 is a cross-sectional view of the second substrate and second micro nanostructure in the metasurface lens according to an embodiment of the present disclosure.
Figure 6:
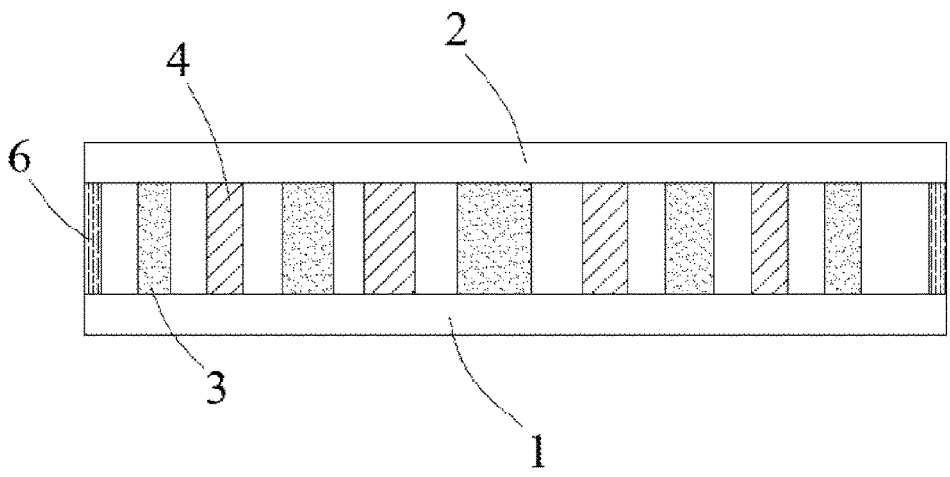
FIGS. 6 and 7 are schematic diagrams of a metasurface lens according to the embodiment of the present disclosure.

As shown in FIGS. 5 and 6, the second substrate 2 can be a rigid substrate, such as a glass substrate. However, the second substrate 2 can also be a flexible substrate, such as a polyimide (PI) substrate. The thickness of the second substrate 2 can be 5 μm-1000 μm. The material of the second substrate 2 and the first substrate 1 can be the same, but they can also be different. It should be noted that the second substrate 2 is a transparent substrate. The second substrate 2 is arranged opposite to the first substrate 1, that is, the second substrate 2 is parallel or roughly parallel to the first substrate 1. Here, the second substrate 2 is spaced apart from the first substrate 1, and the distance between the first substrate 1 and the second substrate 2 can be 200 nm-2 μm. In addition, the area of the second substrate 2 can be smaller than that of the first substrate 1, but the area of the second substrate 2 can be greater than or equal to that of the first substrate 1. For example, if the area of the second substrate 2 is smaller than that of the first substrate 1, the number of the second substrate 2 can be two, three, four, or more, and the multiple second substrates 2 are located on the same side of the first substrate 1. Different second substrates 2 correspond to different areas of the first substrate 1. For example, the number of second substrates 2 is two, and the two second substrates 2 correspond to two areas on the first substrate 1 one by one.

As shown in FIG. 6, the first micro nanostructures 3 are located on the side of the first substrate 1 facing the second substrate 2. The first micro nanostructure 3 can be a colloid. The materials of the colloid can include acrylic ester, epoxy resin, etc. The refractive index of the first micro nanostructure 3 can be greater than or equal to 1.7. The first micro nanostructures 3 can be in a columnar structure, and the orthogonal projection of the first micro nanostructure 3 on the first substrate 1 can be circular, annular, rectangular, or the like. Here, the axis of the first micro nanostructures 3 in a columnar structure can be perpendicular or roughly perpendicular to the first substrate 1. The height of the first micro nanostructure 3 can be 200 nm-1000 nm, that is, the size of the first micro nanostructure 3 in the direction perpendicular to the first substrate 1 can be 200 nm-1000 nm. The width of the first micro nanostructure 3 can be 20 nm-300 nm, that is, the size of the first micro nanostructure 3 in the direction parallel to the first substrate 1 can be 20 nm-300 nm.

As shown in FIGS. 1 and 4, the number of the first micro nanostructures 3 is multiple. The multiple first micro nanostructures 3 can be arranged at intervals, and further, the multiple first micro nanostructures 3 can be distributed in an array. The width of different first micro nanostructures 3 can be the same, but they can also be different. The height of different first micro nanostructures 3 can be the same, but they can also be different. As shown in FIG. 1, the multiple first micro nanostructures 3 can form multiple first structural columns 10. The multiple first structural columns 10 are distributed along a first direction. Adjacent two first structural columns 10 can be arranged in a staggered manner. Of three first structural columns 10 arranged in sequence, the first structural columns 10 located on both ends can be aligned, but it can also be misaligned. The specific arrangement depends on the overall configuration of the metasurface structure.

As shown in FIG. 6, the second micro nanostructures 4 are located on the side of the second substrate 2 facing the first substrate 1. The second micro nanostructure 4 can be colloid. The materials of the colloid can include acrylic ester, epoxy resin, etc. The material of the second micro nanostructure 4 can be the same as that of the first micro nanostructure 3, but it can also be different. The refractive index of the second micro nanostructure 4 can be greater than or equal to 1.7. The refractive index of the second micro nanostructure 4 can be the same as that of the first micro nanostructure 3, but it can also be different. The second micro nanostructures 4 can be in a columnar structure, and the orthographic projection of the second micro nanostructure 4 on the second substrate 2 can be circular, annular, rectangular, or the like. The shape of the second micro nanostructure 4 can be the same as that of the first micro nanostructure 3, but it can also be different. Here, the axis of the second micro nanostructures 4 in a columnar structure can be perpendicular or roughly perpendicular to the second substrate 2. The height of the second micro nanostructure 4 can be 200 nm-1000 nm, that is, the size of the second micro nanostructure 4 in the direction perpendicular to the second substrate 2 can be 200 nm-1000 nm. The height of the second micro nanostructure 4 can be the same as that of the first micro nanostructure 3, but it can also be different. The width of the second micro nanostructure 4 can be 20 nm-300 nm, that is, the size of the second micro nanostructure 4 in the direction parallel to the second substrate 2 can be 20 nm-300 nm. The width of the second micro nanostructure 4 can be the same as that of the first micro nanostructure 3, but it can also be different.

Figure 2:
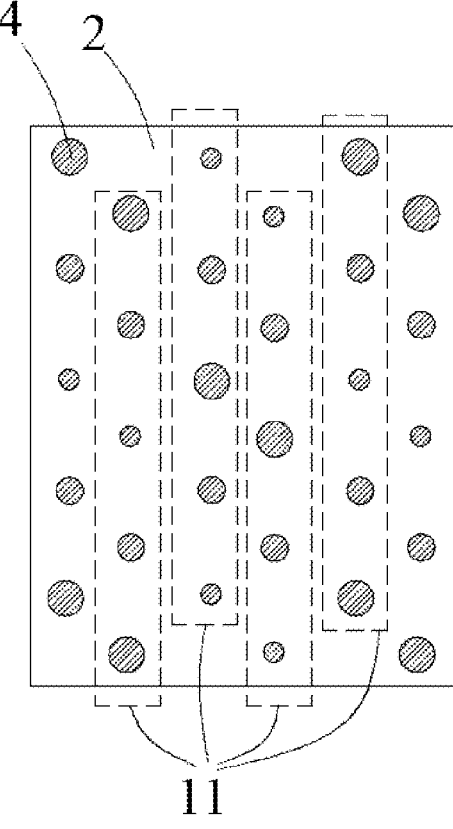
FIG. 2 is a schematic diagram of a second substrate and a second micro nanostructure in the metasurface lens according to an embodiment of the present disclosure.

As shown in FIGS. 2 and 5, the number of the second micro nanostructures 4 is multiple. The multiple second micro nanostructures 4 can be arranged at intervals, and further, the multiple second micro nanostructures 4 can be distributed in an array. The width of different second micro nanostructures 4 can be the same, but they can also be different. The height of different second micro nanostructures 4 can be the same, but they can also be different. The multiple second micro nanostructures 4 can form multiple second structure columns 11. The multiple second structured columns 11 are distributed along the first direction. Adjacent two second structural columns 11 can be arranged in a staggered manner. Of three second structural columns 11 arranged in sequence, the second structural columns 11 located on two ends can be aligned.

Figure 3:
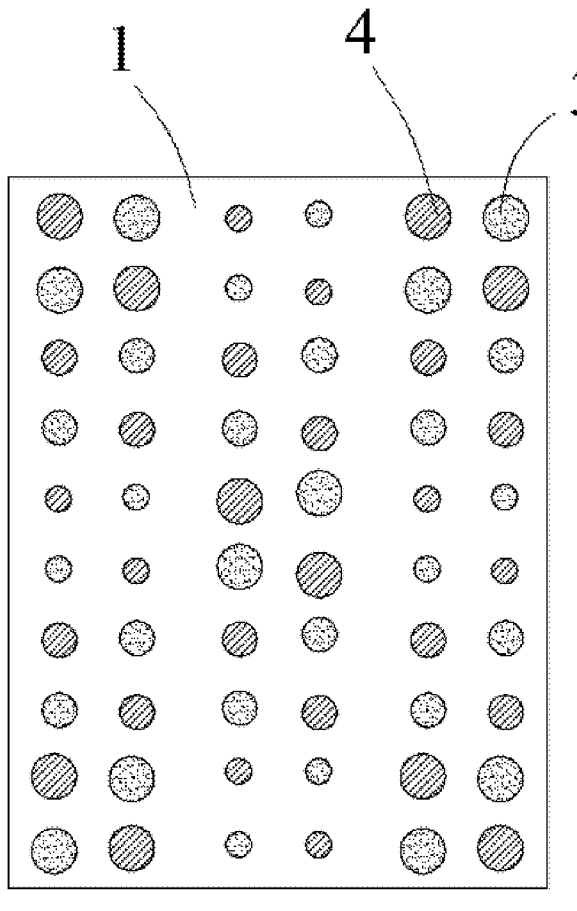
FIG. 3 is a schematic diagram of the first substrate, the first micro nanostructure, and the second micro nanostructure in the metasurface lens according to an embodiment of the present disclosure.

As shown in FIGS. 3 and 6, the orthogonal projections of the first micro nanostructures 3 on the second substrate 2 are spaced with the second micro nanostructures 4. The at least one first micro nanostructure 3 is located in gaps between the multiple second micro nanostructures 4, that is, end of the at least one first micro nanostructure 3 far from the first substrate 1 extends into the gaps between the multiple second micro nanostructures 4. Here, there is only one first micro nanostructure 3 between adjacent two second micro nanostructures 4. However, there can also be two, three, four or more first micro nanostructures 3 between adjacent two second micro nanostructures 4. The at least one second micro nanostructure 4 is located in gaps between the multiple first micro nanostructures 3, that is, end of the at least one second micro nanostructure 4 far from the first substrate 1 extends into the gaps between the multiple first micro nanostructures 3. Here, there is only one second micro nanostructure 4 between adjacent two first micro nanostructures 3. However, there can also be two, three, four or more second micro nanostructures 4 between adjacent two first micro nanostructures 3. For example, the number of the first structural columns 10 can be the same as the number of the second structural columns 11. The multiple first structural columns 10 correspond to the multiple second structural columns 11 one by one, and the multiple first micro nanostructures 3 in the first structural columns 10 and the multiple second micro nanostructures 4 in corresponding second structural columns 11 are arranged in a staggered manner along the extension direction of the first structural columns 10.

Figure 8:
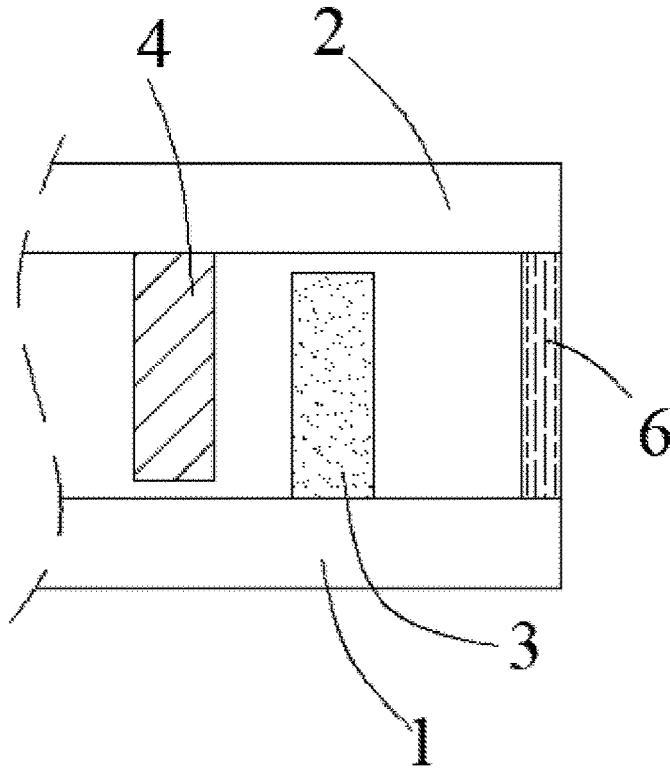
FIGS. 8 and 9 are schematic diagrams of a metasurface lens according to the embodiment of the present disclosure.

As shown in FIG. 6, the metasurface lens according to the embodiment of the present disclosure may also include a connecting structure 6. The connecting structure 6 can be connected between the first substrate 1 and the second substrate 2 to secure the first substrate 1 to the second substrate 2. Taking the multiple first micro nanostructures 3 located in a first imprinting area of the first substrate 1 as an example, the connecting structure 6 can be connected to an area of the first substrate 1 outside the first imprinting area. Taking the multiple second micro nanostructures 4 located in a second area of the second substrate 2 as an example, the connecting structure 6 can be connected to an area of the second substrate 2 outside the second imprinting area. In addition, the connecting structure 6 can be in a circular shape, with multiple first micro nanostructures 3 and multiple second micro nanostructures 4 located within the circular connecting structure 6. For example, the connecting structure 6 can include materials such as adhesive materials mixed with epoxy resin and acrylic ester. As shown in FIG. 8, in the direction perpendicular to the first substrate 1, the size of the first micro nanostructure 3 and/or the size of the second micro nanostructure 4 is smaller than the size of the connecting structure 6, that is, the height of the first micro nanostructure 3 and/or the height of the second micro nanostructure 4 is smaller than the height of the connecting structure 6. With such configuration, during a process of packaging the first substrate 1 and the second substrate 2 to form a cell, collision damage between the first micro nanostructures 3 and the second substrate 2 can be prevented0. It can also prevent collision damage between the second micro nanostructures 4 and the first substrate 1. Here, the height of the first micro nanostructure 3 and/or the height of the second micro nanostructure 4 is smaller than the height of the connecting structure 6 by 20 nm-100 nm.

Figure 7:
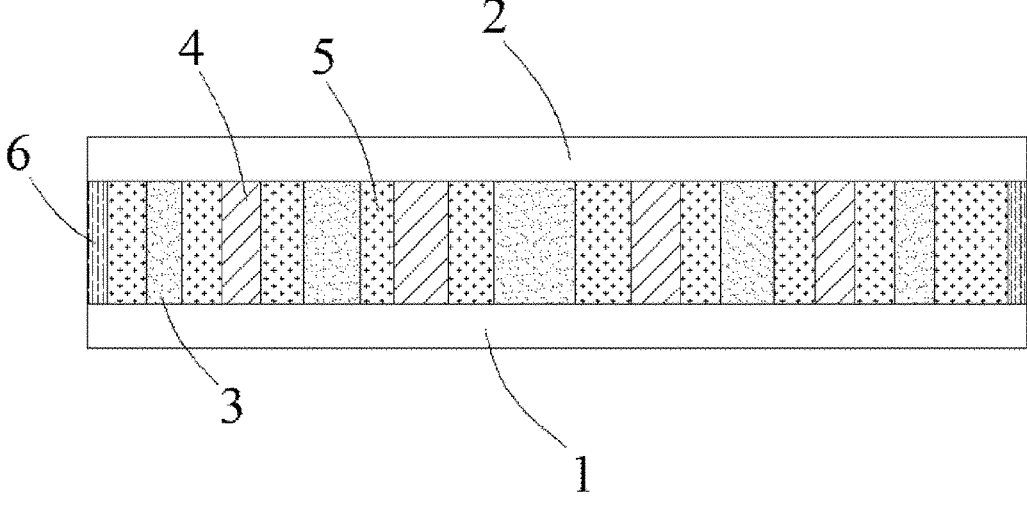

As shown in FIG. 7, the metasurface lens according to the embodiment of the present disclosure may also include a transparent filling layer 5. The transparent filling layer 5 can be located between the first substrate 1 and the second substrate 2, and surrounds the first micro nanostructures 3 and the second micro nanostructures 4. The refractive index of the transparent filling layer 5 can be smaller than that of the first micro nanostructure 3 and/or the second micro nanostructure 4. Specifically, the refractive index of the transparent filling layer 5 can be less than or equal to 1.5. In addition, the materials of the transparent filling layer 5 can include acrylic adhesive materials, adhesive materials mixed with siloxane polymers, and other materials.

The present disclosure also provides a display panel. As shown in FIGS. 12 to 15, the display panel can include a light emitting unit 7 and a metasurface lens according to any of the above embodiments. The metasurface lens can be located on a light emitting side of the light emitting unit 7.

Figure 10:
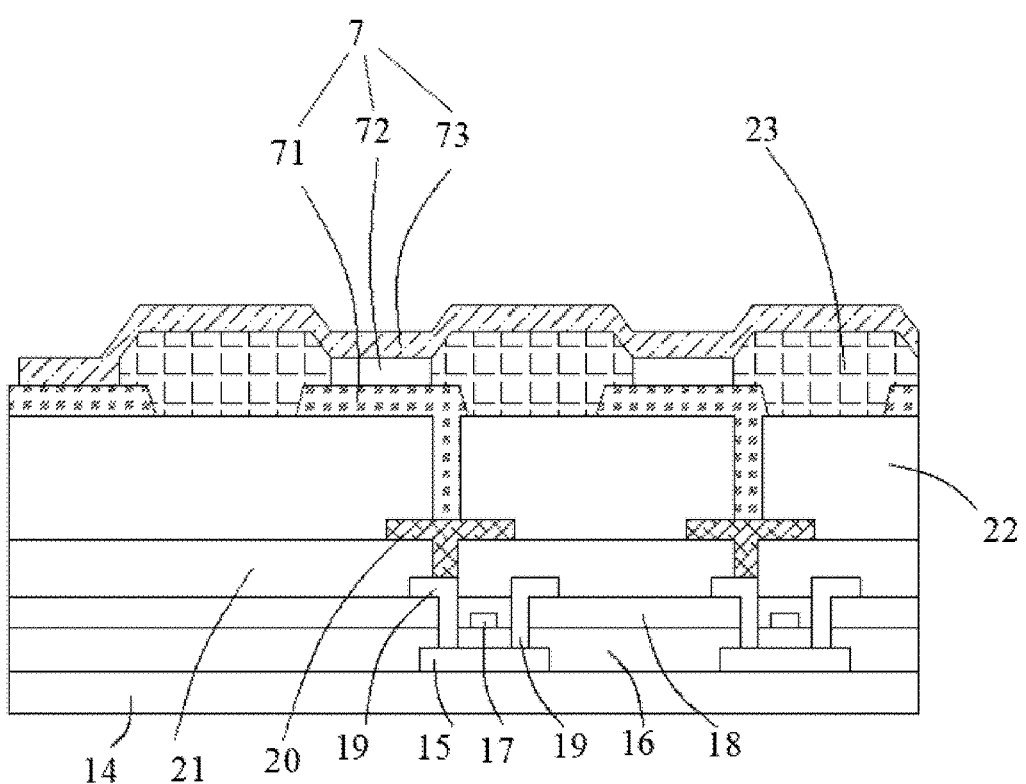
FIGS. 10 and 11 are schematic diagrams of a back panel of a display panel according to the embodiment of the present disclosure.

Specifically, the display panel may include a backplane. The light emitting unit is located on one side of the backplane. In an embodiment of the present disclosure, as shown in FIG. 10, the backplane may include a base substrate 14 and a driving circuit layer. The base substrate 14 can be a rigid substrate. Here, the rigid substrate can be a glass substrate or a PMMA (Polymethyl Methacrylate) substrate, etc. However, the base substrate 14 can also be a flexible substrate. The flexible substrate can be a PET (polyethylene terephthalate) substrate, a PEN (polyethylene naphthylate two formic acid glycol ester) substrate or a PI (polyimide) substrate.

As shown in FIG. 10, the driving circuit layer can be located on the base substrate 14. The driving circuit layer can include a plurality of driving transistors. The driving transistor can be a thin film transistor, but the embodiments of the present disclosure are not limited to this. The thin film transistor can be a top-gate type thin film transistor, but the thin film transistor can also be a bottom-gate type thin film transistor. Taking a thin film transistor as an example, the driving circuit layer can include an active layer 15, a gate insulation layer 16, a gate electrode layer 17, an interlayer insulation layer 18, a first source leakage electrode layer 19, and a second source leakage electrode layer 20. The active layer 15 can be placed on the base substrate 14. The gate insulation layer 16 can be disposed on the base substrate 14 and cover the active layer 15. The gate electrode layer 17 can be located on a side of the gate insulation layer 16 away from the base substrate 14. The interlayer insulation layer 18 can be located on the gate insulation layer 16 and cover the gate electrode layer 17. The first source leakage electrode layer 19 can be located on the interlayer insulation layer 18 and connected to the active layer 15 through a via hole passing through the interlayer insulation layer 18 and the gate insulation layer 16. The backplane can also include a first flattening layer 21 and a second flattening layer 22. The first flattening layer 21 covers the first source leakage electrode layer 19 and the interlayer insulation layer 18. The second source leakage electrode layer 20 can be installed on the first flattening layer 21 and electrically connected to the first source leakage electrode layer 19. The second flattening layer 22 covers the second source leakage electrode layer 20 and the first flattening layer 21.

Figure 11:
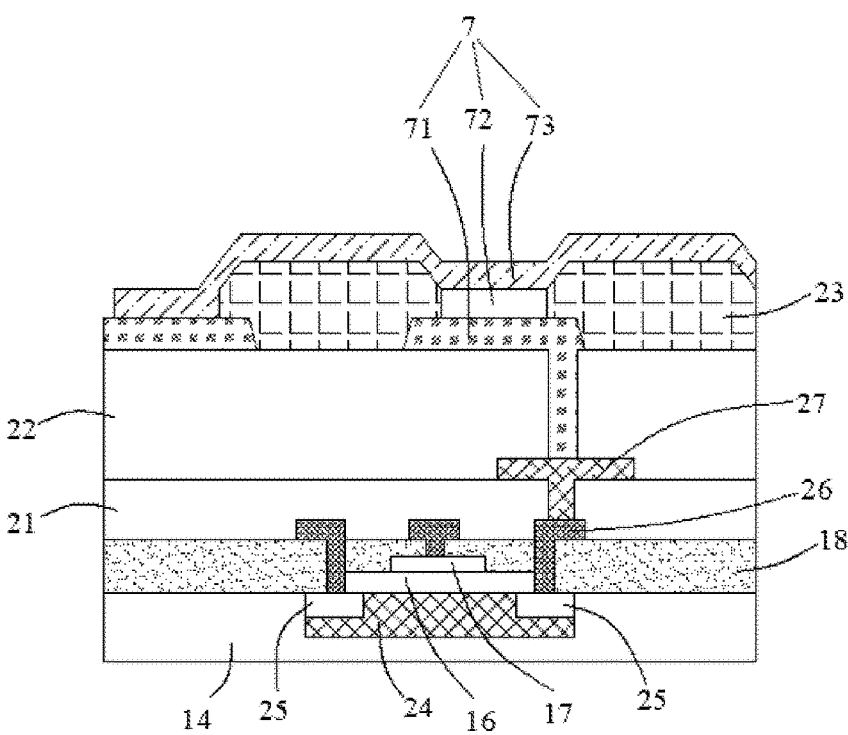

In another embodiment of the present disclosure, as shown in FIG. 11, the base substrate 14 can be a silicon base substrate 14. An active area 24 is disposed within the silicon base substrate 14 and a source drain electrode area 25 is disposed within the active area 24. The backplane can also include a first metal layer 26 and a second metal layer 27. The gate insulation layer 16 is arranged on the active area 24, the gate electrode layer 17 is arranged on the gate insulation layer 16, and the interlayer insulation layer 18 covers the gate electrode layer 17 and the source drain electrode area 25. The first metal layer 26 is located on one side of the interlayer insulation layer 18 facing away from the silicon base substrate 14, and is electrically connected to the source drain electrode area 25 and the gate electrode layer 17. The first flattening layer 21 covers the first metal layer 26 and the interlayer insulation layer 18. The second metal layer 27 is located on one side of the first flattening layer 21 facing away from the silicon base substrate 14, and is electrically connected to the first metal layer 26 through a via hole passing through the first flattening layer 21. The second flattening layer 22 covers the second metal layer 27 and the first flattening layer 21.

Figure 12:
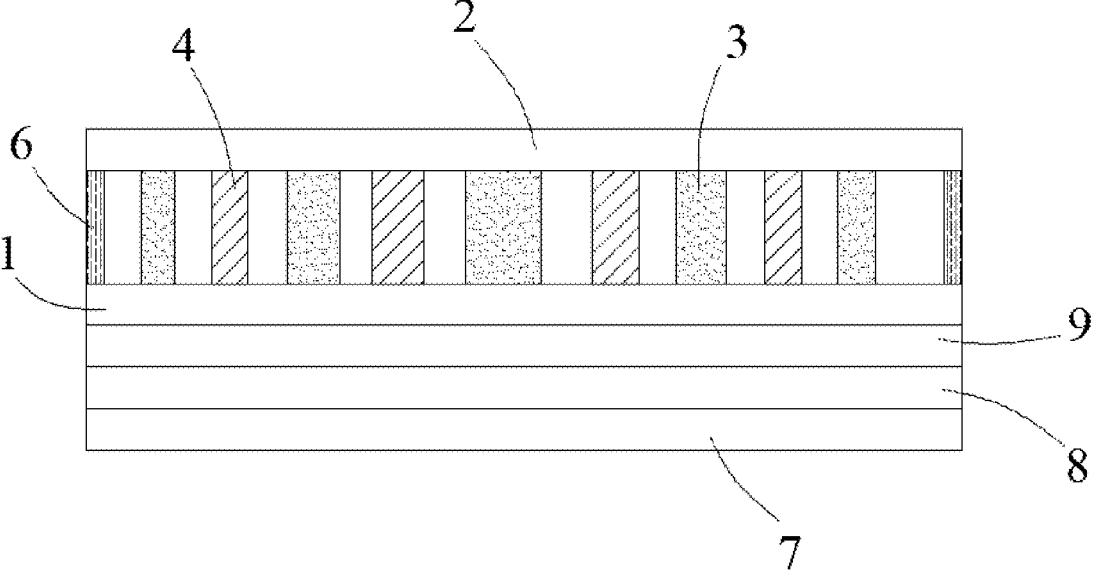
FIGS. 12 to 16 are schematic diagrams of the display panel according to an embodiment of the present disclosure.
Figure 16:
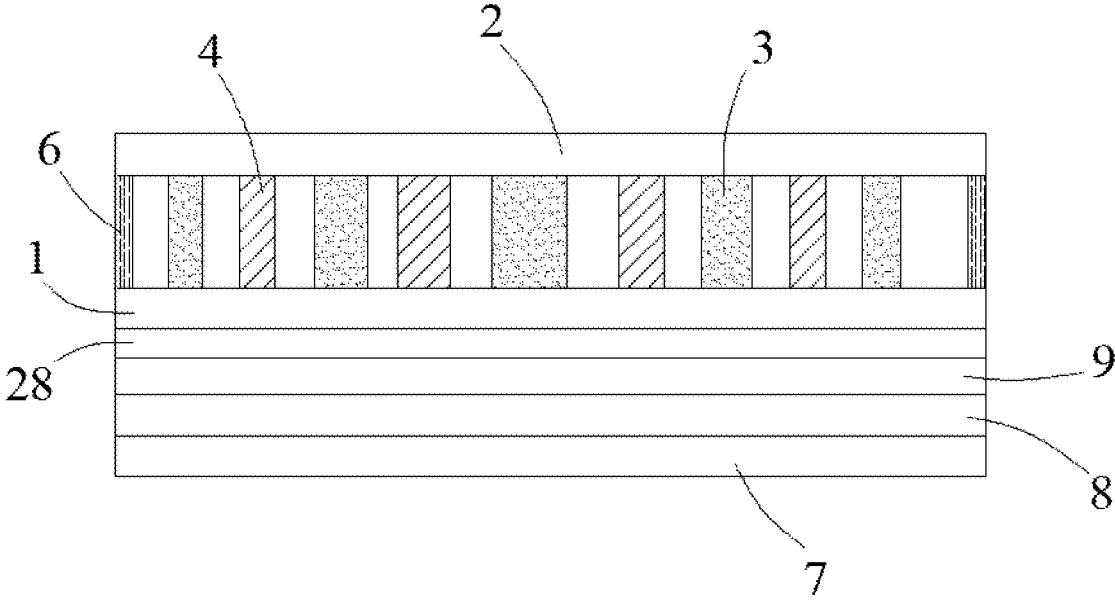

As shown in FIGS. 10, 11, and 12, the display panel may further include a pixel defining layer 23 and a first packaging layer 8. The pixel defining layer 23 can be located on the second flattening layer 22 mentioned above. The pixel defining layer 23 may have pixel openings. The number of pixel openings is multiple, and the array of multiple pixel openings is distributed. The light emitting unit 7 can be located within the pixel opening. The light emitting unit 7 can include an anode 71, a light emitting layer 72, and a cathode 73. The anode 71 can be installed on the second flattened layer 22 exposed by the pixel opening, and connected to the second source leakage electrode layer 20 through a via through the second flattened layer 22. Taking substrate 14 as a silicon base substrate 14 as an example, the anode 71 can be connected to the second metal layer 27 through a via hole passing through the second flattening layer 22. The light emitting layer 72 can be located on one side of the anode 71 facing away from the base substrate 14, and the cathode 73 is disposed on the side of the light emitting layer 72 facing away from the base substrate 14. Here, the light emitting layer 72 can emit white light, indicating that the display panel in the present disclosure is a WOLED device. The first packaging layer 8 can be located on the light emitting unit 7. Specifically, the first packaging layer 8 can be located on one side of the cathode layer 73 facing away from the base substrate 14. The first packaging layer 8 can be a thin film packaging layer (TFE), but the present disclosure does not impose special limitations on this aspect. In addition, the display panel according to an embodiment of the present disclosure can also include a color film substrate 9. The color film substrate 9 can be located on one side of the first packaging layer 8 facing away from the base substrate 14, but the embodiment of the present disclosure is not limited to this. In addition, the color film substrate 9 can be located on a light emitting side of the light emitting unit 7. Taking the base substrate 14 being a silicon base substrate 14 as an example, as shown in FIG. 16, the display panel can also include a second packaging layer 28. The second packaging layer 28 can be located on the side of the color film substrate 9 facing away from the first packaging layer 8.

Figure 13:
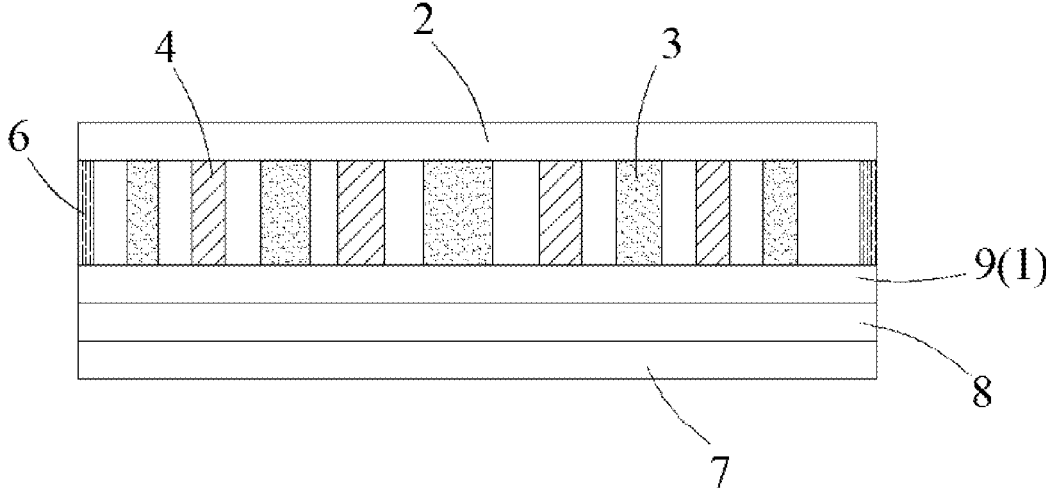

The metasurface lens can be located on one side of the color film substrate 9 facing away from the light emitting unit 7. Specifically, as shown in FIG. 12, the first substrate 1 can be located on the surface of the color film substrate 9 facing away from the light emitting unit 7, and the second substrate 2 can be located on one side of the first substrate 1 facing away from the color film substrate 9. In other embodiments of the present disclosure, as shown in FIG. 13, the color film substrate 9 can form the first substrate 1 of the metasurface lens, and the second substrate 2 can be located on one side of the color film substrate 9 facing away from the light emitting unit 7.

Figure 14:
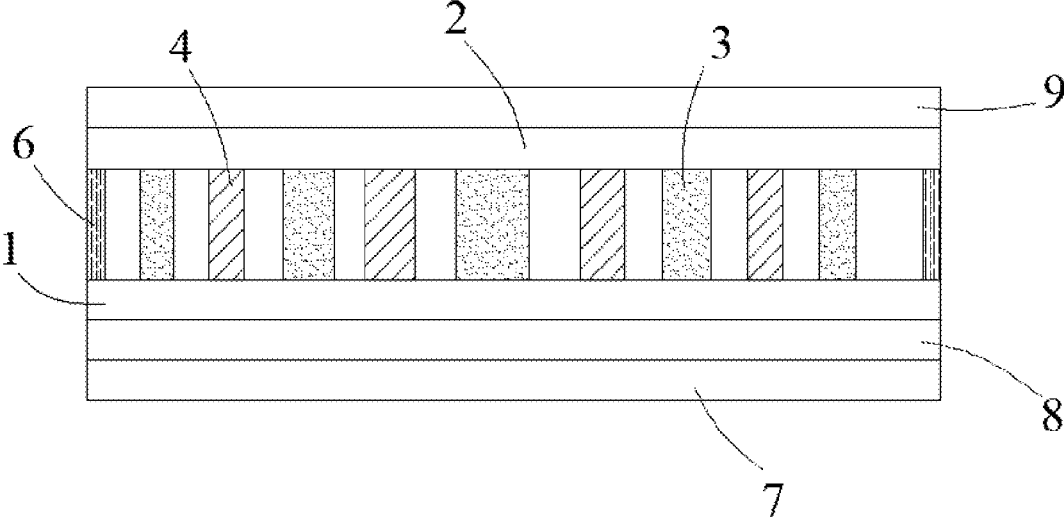
Figure 15:
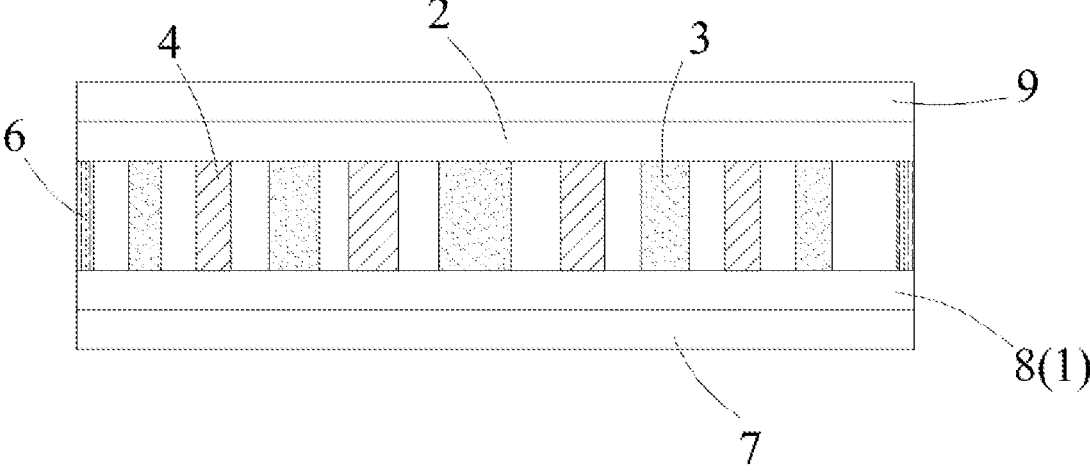

The metasurface lens described above can be located on the side of the color film substrate 9 facing the light emitting unit 7. Here, the metasurface lens can be located between the color film substrate 9 and the light emitting unit 7. Furthermore, as shown in FIG. 14, the metasurface lens can be located on one side of the first packaging layer 8 facing away from the light emitting unit 7. In another embodiment of the present disclosure, as shown in FIG. 15, the first packaging layer 8 can form the first substrate 1 of the metasurface lens, and the second substrate 2 can be located on one side of the first packaging layer 8 facing away from the light emitting unit 7. In addition, taking the base substrate 14 being a silicon base substrate 14 as an example, as shown in FIG. 16, the metasurface lens can also be located on one side of the second packaging layer 28 facing away from the light emitting unit 7. However, the second packaging layer 28 can also form the first substrate 1 of the metasurface lens, and the second substrate 2 can be located on one side of the second packaging layer 28 facing away from the light emitting unit 7. It should be noted that when the base substrate 14 is a silicon base substrate 14, the structure shown in FIGS. 12 to 15 also needs to be equipped with a second packaging layer 28.

The embodiment of the present disclosure also provides a manufacturing method of a metasurface lens for manufacturing the metasurface lens described in the above embodiment. The manufacturing method of the metasurface lens can include steps S10 to S30.

Step S10: providing a first substrate 1, forming multiple first micro nanostructures 3 arranged at intervals on one side of the first substrate 1.

Step S20: providing a second substrate 2, forming multiple second micro nanostructures 4 at intervals on one side of the second substrate 2 to form a cell.

Step S30, aligning one side of the first substrate 1 having the first micro nanostructure 3 with one side of the second substrate 2 having the second micro nanostructure 4. Here, at least one first micro nanostructure 3 is located in gaps between multiple second micro nanostructures 4, and at least one second micro nanostructure 4 is located in gaps between multiple first micro nanostructures 3.

The following provides a detailed explanation of each step of the manufacturing method of the metasurface lens according to the embodiment of the present disclosure:

In step S10, a first substrate 1 is provided and multiple first micro nanostructures 3 arranged at intervals are formed on one side of the first substrate 1.

Figure 9:
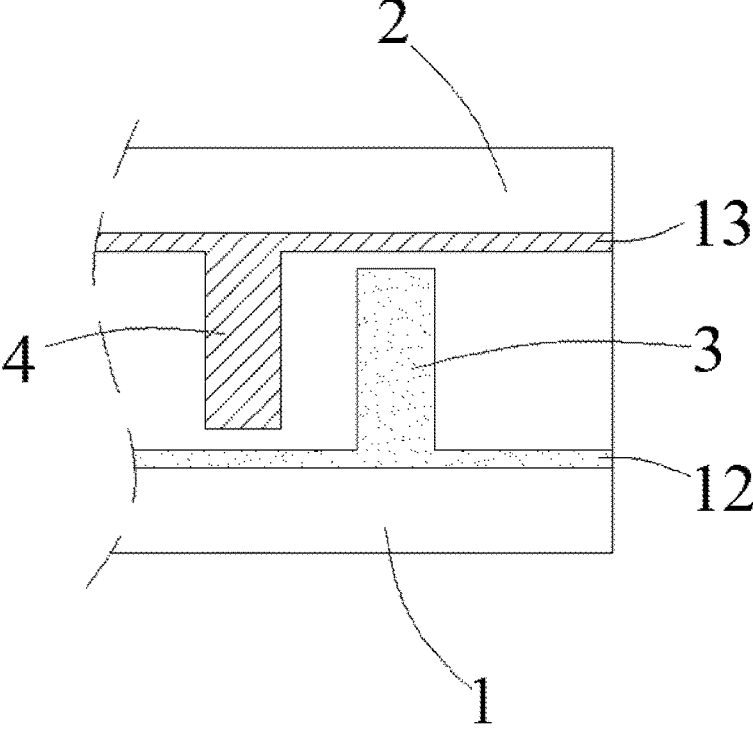

Specifically, forming multiple first micro nanostructures 3 arranged at intervals on one side of the first substrate 1 may include: forming a first adhesive layer on one side of the first substrate 1, and imprinting the first adhesive layer to form multiple first micro nanostructures 3 arranged at intervals. In addition, as shown in FIG. 9, there is a first residual adhesive layer 12 left on one side of the first substrate 1. The first residual adhesive layer 12 is the residual adhesive formed after the first adhesive layer is imprinted.

In step S20, a second substrate 2 is provided, multiple second micro nanostructures 4 arranged at intervals are formed on one side of the second substrate 2.

Specifically, forming multiple second micro nanostructures 4 at intervals on one side of the second substrate 2 may include: forming a second adhesive layer on one side of the second substrate 2, and imprinting the second adhesive layer to form multiple second micro nanostructures 4 arranged at intervals. The material of the first adhesive layer and the material of the second adhesive layer can be the same or different. The material of the first adhesive layer and the refractive index of the second adhesive layer can be the same or different. In addition, the present disclosure can use the same imprinting plate to imprint the first and second adhesive layers, in order to simplify the manufacturing process and reduce costs. In addition, as shown in FIG. 9, a second residual adhesive layer 13 is left on one side of the second substrate 2. The second residual adhesive layer 13 is the residual adhesive formed after the second adhesive layer is imprinted.

In step S30, one side of the first substrate 1 having the first micro nanostructure 3 is aligned with one side of the second substrate 2 having the second micro nanostructure 4 to form a cell. Here, at least one first micro nanostructure 3 is located in gaps between multiple second micro nanostructures 4, and at least one second micro nanostructure 4 is located in gaps between multiple first micro nanostructures 3.

The present disclosure can provide a connecting structure 6 on one side of the first substrate 1 having the first micro nanostructures 3, but the connecting structure 6 can also be provided on one side of the second substrate 2 having the second micro nanostructures 4. The connecting structure 6 can be a frame adhesive to connect the first substrate 1 to the second substrate 2.

In addition, prior to step S30, the manufacturing method disclosed herein may further include: filling transparent colloidal materials in the gaps between the multiple first micro nanostructures 3; or, filling transparent colloidal materials in the gaps between the multiple second micro nanostructures 4; or, filling transparent colloidal materials in the gaps between the multiple first micro nanostructures 3 and the multiple second micro nanostructures 4. Here, the refractive index of the transparent colloidal material can be lower than that of the first micro nanostructure 3 and the second micro nanostructure 4. After aligning the side of the first substrate 1 having the first micro nanostructures 3 with the side of the second substrate 2 having the second micro nanostructures 4 to form a cell, the manufacturing method disclosed in the present disclosure can further include: curing the transparent colloidal materials through a thermal curing process or an ultraviolet curing process to form a transparent filling layer 5.

The metasurface lens and the manufacturing method of the metasurface lens and the display panels provided in the present disclosure belong to the same inventive concept. The relevant details and descriptions of beneficial effects can be referred to each other and will not be further elaborated.

The above is only a preferred embodiment of the present disclosure and does not impose any formal limitations on it. Although the present disclosure has been disclosed in a preferred embodiment, it is not intended to limit the present disclosure. Any those skilled in the art can, within the scope of the disclosed technical solution, make some changes or modifications to equivalent embodiments using the disclosed technical content. Any simple modifications, equivalent changes, or modifications made to the above embodiments based on the technical essence of the present disclosure, which are not separate from the content of the disclosed technical solution, shall still fall within the scope of this disclosed technical solution.

What is claimed is:

1. A metasurface lens, comprising:
   a first substrate and a second substrate disposed opposite to each other;

first micro nanostructures arranged at intervals on one side of the first substrate facing the second substrate;

second micro nanostructures arranged at intervals on one side of the second substrate facing the first substrate; and a transparent filling layer between the first substrate and the second substrate, and surrounding the first micro nanostructures and the second micro nanostructures, wherein a refractive index of the transparent filling layer is lower than that of the first micro nanostructures or that of the second micro nanostructures, wherein at least one of the first micro nanostructures is in a gap among the second micro nanostructures, and at least one of the second micro nanostructures is in a gap among the first micro nanostructures.

2. The metasurface lens according to claim 1, wherein some of the first micro nanostructures and some of the second micro nanostructures are arranged in a staggered manner in a first direction.

3. The metasurface lens according to claim 1, wherein the first micro nanostructures form first structural columns, and the first structural columns are distributed along a first direction; wherein the second micro nanostructures form second structural columns, and the second structural columns are distributed along the first direction;

wherein the first structural columns correspond to the second structural columns one by one, and first micro nanostructures in each of the first structural columns are staggered with second micro nanostructures in a corresponding second structural column along an extension direction of the each first structural column.

4. The metasurface lens according to claim 3, wherein adjacent two of the first structural columns are arranged in a staggered manner, and among three first structural columns arranged in sequence, the first structural columns located on both ends are aligned;

adjacent two of the second structural columns are arranged in a staggered manner, and for three second structural columns arranged in sequence, the second structural columns located on both ends are aligned.

5. The metasurface lens according to claim 1, wherein a refractive index of the first micro nanostructures is the same as or different from a refractive index of the second micro nanostructures.

6. The metasurface lens according to claim 1, wherein a material of the first micro nanostructures is the same as or different from a material of the second micro nanostructures.

7. The metasurface lens according to claim 1, wherein the metasurface lens satisfies at least one of the following:

a size of the first micro nanostructures in a direction perpendicular to the first substrate is 200 nm-1000 nm;

a size of the first micro nanostructures in a direction parallel to the first substrate is 20 nm-300 nm;

a size of the second micro nanostructures in a direction perpendicular to the second substrate is 200 nm-1000 nm; or a size of the second micro nanostructures in a direction parallel to the second substrate is 20 nm-300 nm.

8. The metasurface lens according to claim 1, wherein a number of the second substrates is multiple, and the multiple second substrates are located on the same side of the first substrate, with different second substrates corresponding to different areas of the first substrate.

9. The metasurface lens according to claim 1, further comprising:

a connecting structure between the first substrate and the second substrate, in a direction perpendicular to the first substrate, a size of the first micro nanostructures and a size of the second micro nanostructures is smaller than a size of the connecting structure.

10. The metasurface lens according to claim 9, wherein the first substrate comprises a first imprinting area, and the first micro nanostructures are in the first imprinting area; wherein the second substrate comprises a second imprinting area, and the second micro nanostructures are in the second imprinting area;

wherein the connecting structure is connected to an area of the first substrate outside the first imprinting area, and connected to an area of the second substrate outside the second imprinting area.

11. The metasurface lens according to claim 9, wherein a size of the first micro nanostructures and a size of the second micro nanostructures is smaller than a size of the connecting structure by 20 nm-100 nm in a direction perpendicular to the first substrate.

12. The metasurface lens according to claim 9, wherein the connecting structure comprises a colloidal material.

13. A display panel, comprising:

a light emitting unit;

the metasurface lens according to claim 1, located on a light emitting side of the light emitting unit.

14. The display panel according to claim 13, further comprising:

a color film substrate on the light emitting side of the light emitting unit, wherein the metasurface lens is on a side of the color film substrate facing away from the light emitting unit.

15. The display panel according to claim 13, further comprising:

a color film substrate on the light emitting side of the light emitting unit, wherein the color film substrate is in the first substrate, the second substrate is on a side of the color film substrate facing away from the light emitting unit.

16. The display panel according to claim 13, further comprising:

a color film substrate on the light emitting side of the light emitting unit, wherein the metasurface lens is between the color film substrate and the light emitting unit.

17. The display panel according to claim 13, further comprising:

a first packaging layer on the light emitting unit;

wherein the metasurface lens is on one side of the first packaging layer facing away from the light emitting unit.

18. The display panel according to claim 13, further comprising:

a first packaging layer on the light emitting unit; wherein the first packaging layer is in the first substrate, and the second substrate is on one side of the first packaging layer facing away from the light emitting unit.

19. A manufacturing method of a metasurface lens, comprising:

providing a first substrate;

forming multiple first micro nanostructures arranged at intervals on one side of the first substrate;

providing a second substrate;

forming multiple second micro nanostructures arranged at intervals on one side of the second substrate;

filling transparent colloidal materials in gaps between the multiple first micro nanostructures; or, filling transparent colloidal materials in gaps between the multiple second micro nanostructures; or filling transparent colloidal materials in gaps between the multiple first micro nanostructures and gaps between the multiple second micro nanostructures; wherein a refractive index of the transparent colloidal material is smaller than a refractive index of the first micro nanostructures or the second micro nanostructures;

aligning one side of the first substrate having the first micro nanostructures with one side of the second substrate having the second micro nanostructures to form a cell; and curing the transparent colloidal materials through a heat curing process or an ultraviolet curing process to form a transparent filling layer, wherein at least one of the first micro nanostructures is located in gaps between multiple of the second micro nanostructures, and at least one of the second micro nanostructures is located in gaps between multiple of the first micro nanostructures.

20. A metasurface lens, comprising:

a first substrate and a second substrate disposed opposite to each other;

first micro nanostructures arranged at intervals on one side of the first substrate facing the second substrate;

second micro nanostructures arranged at intervals on one side of the second substrate facing the first substrate; and a connecting structure between the first substrate and the second substrate, in a direction perpendicular to the first substrate, a size of the first micro nanostructures and a size of the second micro nanostructures is smaller than a size of the connecting structure, wherein at least one of the first micro nanostructures is in a gap among the second micro nanostructures, and at least one of the second micro nanostructures is in a gap among the first micro nanostructures.

\* \* \* \* \*